(12) United States Patent
Nakayabu

(10) Patent No.: US 7,259,970 B2
(45) Date of Patent: Aug. 21, 2007

(54) SUBSTRATE, CONNECTING STRUCTURE AND ELECTRONIC EQUIPMENT

(75) Inventor: Hiroshige Nakayabu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/195,276

(22) Filed: Aug. 2, 2005

(65) Prior Publication Data

US 2005/0263898 A1  Dec. 1, 2005

Related U.S. Application Data

(62) Division of application No. 10/310,007, filed on Dec. 4, 2002, now Pat. No. 6,944,030.

(30) Foreign Application Priority Data

Apr. 15, 2002  (JP) ............................. 2002-112247

(51) Int. Cl.
*H05K 7/02* (2006.01)
*H05K 7/04* (2006.01)

(52) U.S. Cl. ...................... 361/810; 361/770; 361/809; 174/254

(58) Field of Classification Search ........ 361/760–761, 361/683–686, 752–759; 174/254–258, 138 G, 174/138 F
See application file for complete search history.

(56) References Cited

U.S. PATENT DOCUMENTS

| 3,716,846 | A |  | 2/1973 | Volckart et al. ........ 340/174 M |
|---|---|---|---|---|
| 4,364,619 | A |  | 12/1982 | Inayat-Khan ............. 339/17 F |
| 4,858,073 | A |  | 8/1989 | Gregory ...................... 361/388 |
| 5,442,142 | A |  | 8/1995 | Hayashi ...................... 174/250 |
| 5,592,365 | A |  | 1/1997 | Sugimoto et al. ........... 361/789 |
| 5,679,928 | A | * | 10/1997 | Okano et al. ................ 174/261 |
| 6,189,602 | B1 | * | 2/2001 | Tanahashi et al. ............ 165/86 |
| 6,459,043 | B1 |  | 10/2002 | Dodsworth .................. 174/254 |
| 6,531,662 | B1 | * | 3/2003 | Nakamura .................. 174/255 |
| 6,786,762 | B2 | * | 9/2004 | Buck et al. .................. 439/493 |
| 2001/0007287 | A1 |  | 7/2001 | Hoche ......................... 174/250 |
| 2002/0019154 | A1 |  | 2/2002 | Na ............................. 439/76.1 |

FOREIGN PATENT DOCUMENTS

| GB | 2 331 188 A | 5/1999 |
|---|---|---|
| JP | 01140700 | 6/1989 |
| JP | 04290299 | 10/1992 |
| JP | 05037119 | 2/1993 |
| JP | 06224531 | 8/1994 |
| JP | 07-162122 | 6/1995 |
| JP | 08228059 | 9/1996 |

* cited by examiner

*Primary Examiner*—Tuan Dinh
(74) *Attorney, Agent, or Firm*—Greer, Burns & Crain, Ltd.

(57) ABSTRACT

A substrate has an electrical wiring pattern formed thereon, one or a plurality of electrical parts provided thereon, a first contacting part and a second contacting part provided thereon and electrically connected to the electronic parts, and one or a plurality of electrical connecting bodies. The electrical connecting bodies are different from the electrical wiring pattern, and electrically connect the first contacting part and the second contacting part.

15 Claims, 10 Drawing Sheets

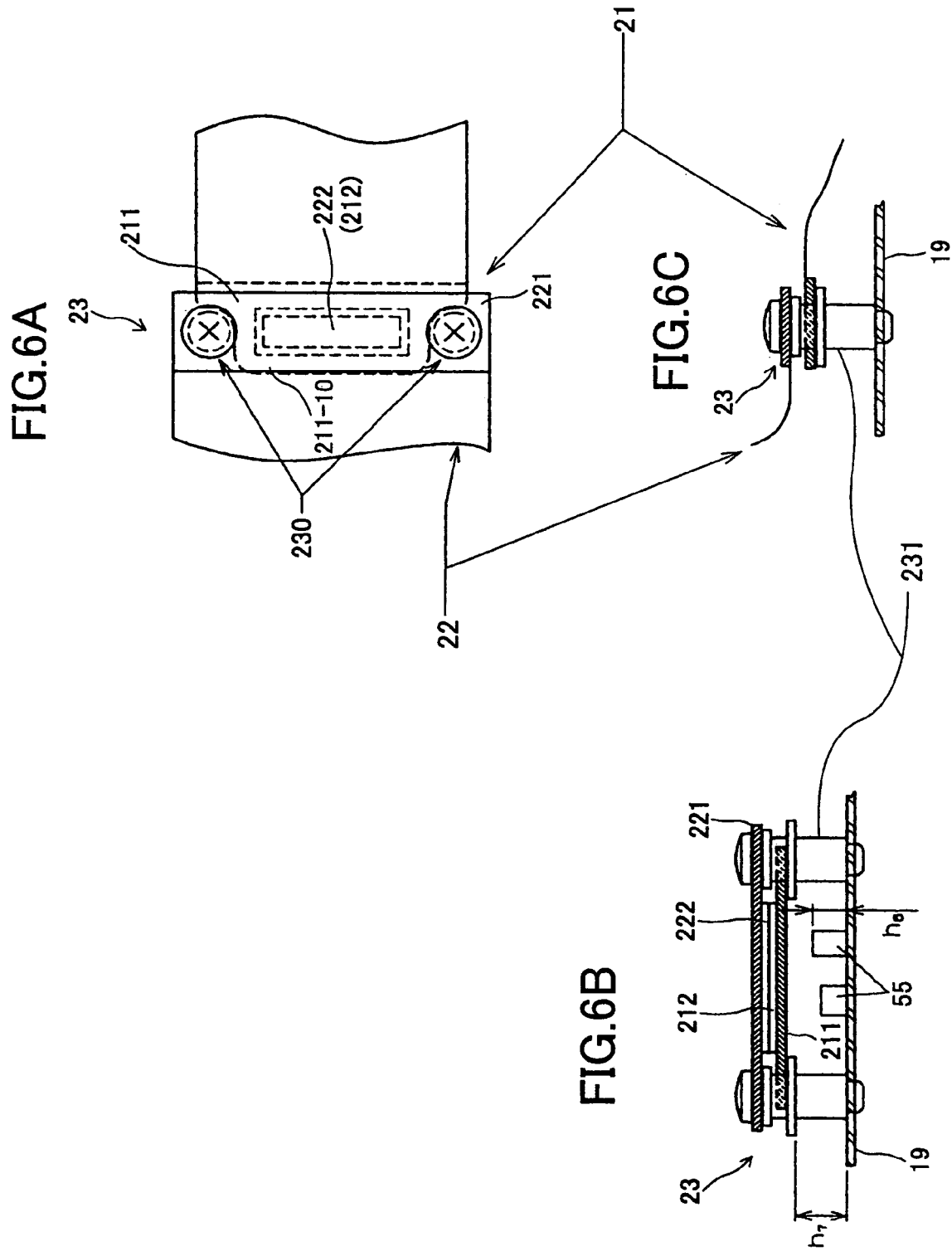

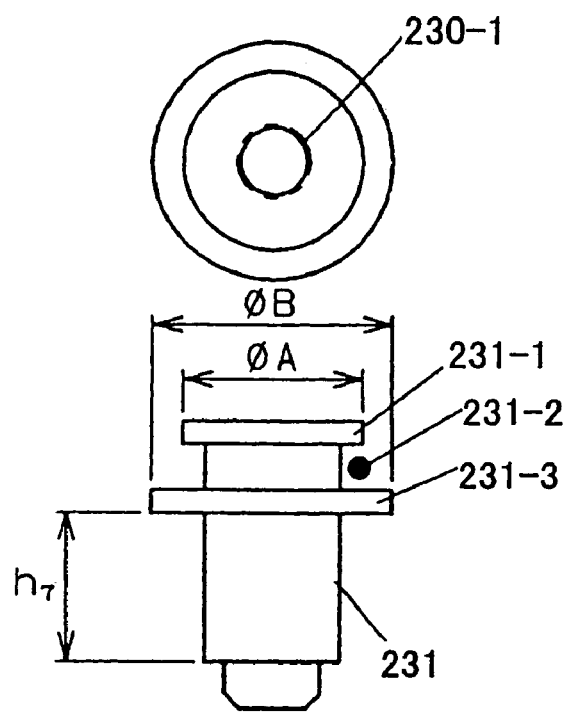
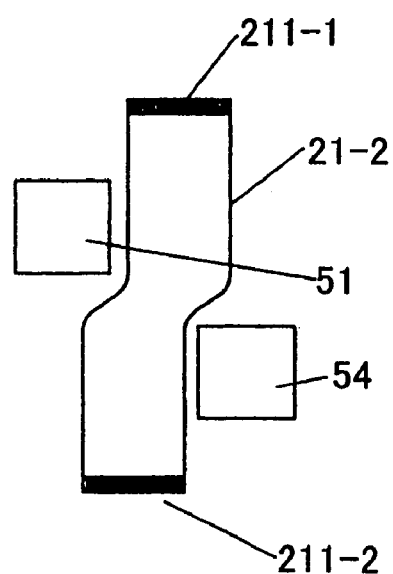

SUBSTRATE, CONNECTING STRUCTURE AND ELECTRONIC EQUIPMENT

This is a divisional of application Ser. No. 10/310,007, filed Dec. 4, 2002 now U.S. Pat. No. 6,944,030.

BACKGROUND OF THE INVENTION

This application claims the benefit of a Japanese Patent Application No. 2002-112247 filed Apr. 15, 2002, in the Japanese Patent Office, the disclosure of which is hereby incorporated by reference.

1. Field of the Invention

The present invention generally relates to substrates, connecting structures and electronic equipments, and more particularly to a substrate which uses an electrical connecting body such as a flexible printed circuit (FPC), a connecting structure which uses an electrical connecting body such as the FPC and is suited for connecting a main body and a lid which opens and closes with respect to the main body, and an electronic equipment having such a substrate or connecting structure.

In this specification, the electronic equipment refers to information processing apparatuses such as a lap-top personal computer, portable telephones and the like which are made up of a main body and a lid which opens and closes with respect to the main body.

2. Description of the Related Art

For example, the lap-top personal computer is made up of the main body and the lid which opens and closes with respect to the main body. A substrate mounted with various parts such as integrated circuit devices (IC chips) is provided within the main body, and a display section made up of a liquid crystal display (LCD) or the like is provided within the lid. Because the lid opens and closes with respect to the main body, the display section and the substrate are electrically connected via the FPC. One end of the FPC is connected to the display section, and the other end of the FPC is connected to a connecting part which is provided at an end portion on the substrate. The connecting part is connected to the electronic parts such as the IC chips on the substrate via a printed wiring formed on the substrate.

The printed wiring on the substrate may be provided on both top and bottom surfaces of the substrate but the printed wiring must be arranged avoiding positions where the various parts are mounted on the substrate and positions where holes and cutouts are formed in the substrate. Signals supplied to the display section employ the LVDS system or the like, and are high-speed and small-amplitude signals. Hence, the substrate must satisfy various layout and wiring conditions, such as limited wiring length and wiring layout for preventing mixture of external noise. Accordingly, depending on the layout and wiring conditions, it is necessary to take measures such as arranging the IC chip for driving the display section in a vicinity of the connecting part on the substrate, and arranging the printed wiring on the substrate at a position separated from other printed wiring for the high-speed signals.

Recently, due to increased operation speeds of internal circuits of the CPU or the like, heat generated from the IC chips mounted on the substrate has become large. For this reason, it has become necessary to provide holes and cutouts in the substrate, and to provide radiator parts or heat sinks at the holes and cutouts so as to improve the heat radiation or heat release from the IC chips. In order to improve the heat radiation, the radiator parts must be made large, which means that the corresponding holes and cutouts in the substrate must also be made large. The printed wiring on the substrate must be arranged avoiding these holes, cutouts and radiator parts.

On the other hand, in order to meet the demands to further reduce the size of the lap-top personal computer, gaps or spacings between the parts mounted on the substrate are becoming smaller. As a result, the degree of freedom of wiring is decreasing for the printed wiring on the substrate.

It is conceivable to provide a multi-layer (or multi-level) wiring structure on the substrate, but the structure of the substrate will become complex. In addition, as the multi-layer wiring structure itself and the connections of the various wiring layers and the electronic parts such as the IC chips become more complex, the assembling process becomes complex, to thereby increase both the production cost of the substrate and the thickness of the substrate. Hence, it is difficult to realize a thin lap-top personal computer using the substrate having the multi-layer wiring structure.

Therefore, in the conventional electronic equipment, there are problems in that it is difficult to conform to the various restrictions with respect to the printed wiring on the substrate, secure a relatively large degree of freedom of wiring, and electrically connect a portion on the substrate and another portion, while simultaneously meeting the demands to reduce both the cost and size of the electronic equipment.

SUMMARY OF THE INVENTION

Accordingly, it is a general object of the present invention to provide a novel and useful substrate, connecting structure and electronic equipment, in which the problems described above are eliminated.

Another and more specific object of the present invention is to provide a substrate, a connecting structure and an electronic equipment which can conform to the various restrictions with respect to the printed wiring on the substrate, secure a relatively large degree of freedom of wiring, and electrically connect a portion on the substrate and another portion, while simultaneously meeting the demands to reduce both the cost and size of the electronic equipment.

Still another object of the present invention is to provide a substrate comprising an electrical wiring pattern formed on the substrate; one or a plurality of electrical parts provided on the substrates; a first contacting part and a second contacting part provided on the substrate and electrically connected to the electronic parts; and one or a plurality of electrical connecting bodies, different from the electrical wiring pattern, electrically connecting the first contacting part and the second contacting part. According to the substrate of the present invention, it is possible to conform to the various restrictions with respect to the printed wiring on the substrate, secure a relatively large degree of freedom of wiring, and electrically connect a portion on the substrate and another portion, while simultaneously meeting the demands to reduce both the cost and size of the electronic equipment.

A further object of the present invention is to provide a substrate comprising an electrical wiring pattern formed on the substrate; one or a plurality of electrical parts provided on the substrate; and a first contacting part and a second contacting part provided on the substrate and electrically connected to the electronic parts, wherein the first contacting part and the second contacting part are electrically connected via one or a plurality of electrical connecting bodies which are different from the electrical wiring pattern. According to the substrate of the present invention, it is possible to conform to the various restrictions with respect to the printed wiring on the substrate, secure a relatively large degree of freedom of wiring, and electrically connect a portion on the substrate and another portion, while simultaneously meeting the demands to reduce both the cost and size of the electronic equipment.

Another object of the present invention is to provide a connecting structure for connecting a first electrical connecting body and a second electrical connecting body, the first electrical connecting body having a first contacting part electrically connected to one or a plurality of electronic parts provided on a first surface of a substrate and a second contacting part, the second electrical connecting body having a first contacting part electrically connected externally to the substrate and a second contacting part, comprising a connecting part, provided on the substrate, electrically connecting the second contacting part of the first electrical connecting body and the second contacting part of the second electrical connecting body at a height position separated by a predetermined distance from the first surface of the substrate. According to the connecting structure of the present invention, it is possible to conform to the various restrictions with respect to the printed wiring on the substrate, secure a relatively large degree of freedom of wiring, and electrically connect a portion on the substrate and another portion, while simultaneously meeting the demands to reduce both the cost and size of the electronic equipment.

Still another object of the present invention is to provide an electronic equipment comprising a substrate having an electrical wiring pattern formed thereon; a first contacting part provided on the substrate and electrically connected to one or more electronic parts provided on the substrate; a second contacting part provided on the substrate; and an electrical connecting body, different from the electrical wiring pattern, electrically connecting the first contacting part and the second contacting part. According to the electronic equipment of the present invention, it is possible to conform to the various restrictions with respect to the printed wiring on the substrate, secure a relatively large degree of freedom of wiring, and electrically connect a portion on the substrate and another portion, while simultaneously meeting the demands to reduce both the cost and size of the electronic equipment.

Another object of the present invention is to provide an electronic equipment comprising a substrate having an electrical wiring pattern formed thereon; a first contacting part provided on the substrate and electrically connected to one or more electronic parts provided on the substrate; and a second contacting part provided on the substrate, where the first contacting part and the second contacting part are electrically connected by an electrical connecting body which is different from the electrical wiring pattern. According to the electronic equipment of the present invention, it is possible to conform to the various restrictions with respect to the printed wiring on the substrate, secure a relatively large degree of freedom of wiring, and electrically connect a portion on the substrate and another portion, while simultaneously meeting the demands to reduce both the cost and size of the electronic equipment.

A further object of the present invention is to provide an electronic equipment comprising a main body internally having a substrate and a first electrical connecting body, the first electrical connecting body having a first contacting part electrically connected to one or more electronic parts provided on a first surface of the substrate and a second contacting part; a lid which opens and closes with respect to the main body; a second electrical connecting body electrically connecting the lid and the substrate, the second electrical connecting body having a first contacting part electrically connected to the lid and a second contacting part; and a connecting part, provided on the substrate, electrically connecting the second contacting part of the first electrical connecting body and the second contacting part of the second electrical connecting body at a height position separated by a predetermined distance from the first surface of the substrate. According to the electronic equipment of the present invention, it is possible to conform to the various restrictions with respect to the printed wiring on the substrate secure a relatively large degree of freedom of wiring, and electrically connect a portion on the substrate and another portion, while simultaneously meeting the demands to reduce both the cost and size of the electronic equipment.

Other objects and further features of the present invention will be apparent from the following detailed description when read in conjunction with the accompanying drawings.

BRIEF DESCRIPTION OF THE DRAWINGS

FIGS. 6A, 6B and 6C are diagrams showing the structure of a connecting part;

FIGS. 7A and 7B are diagrams for explaining a screw portion of the connecting part;

FIG. 8 is a diagram for explaining a first embodiment of the FPC;

DESCRIPTION OF THE PREFERRED EMBODIMENTS

Figure 1:
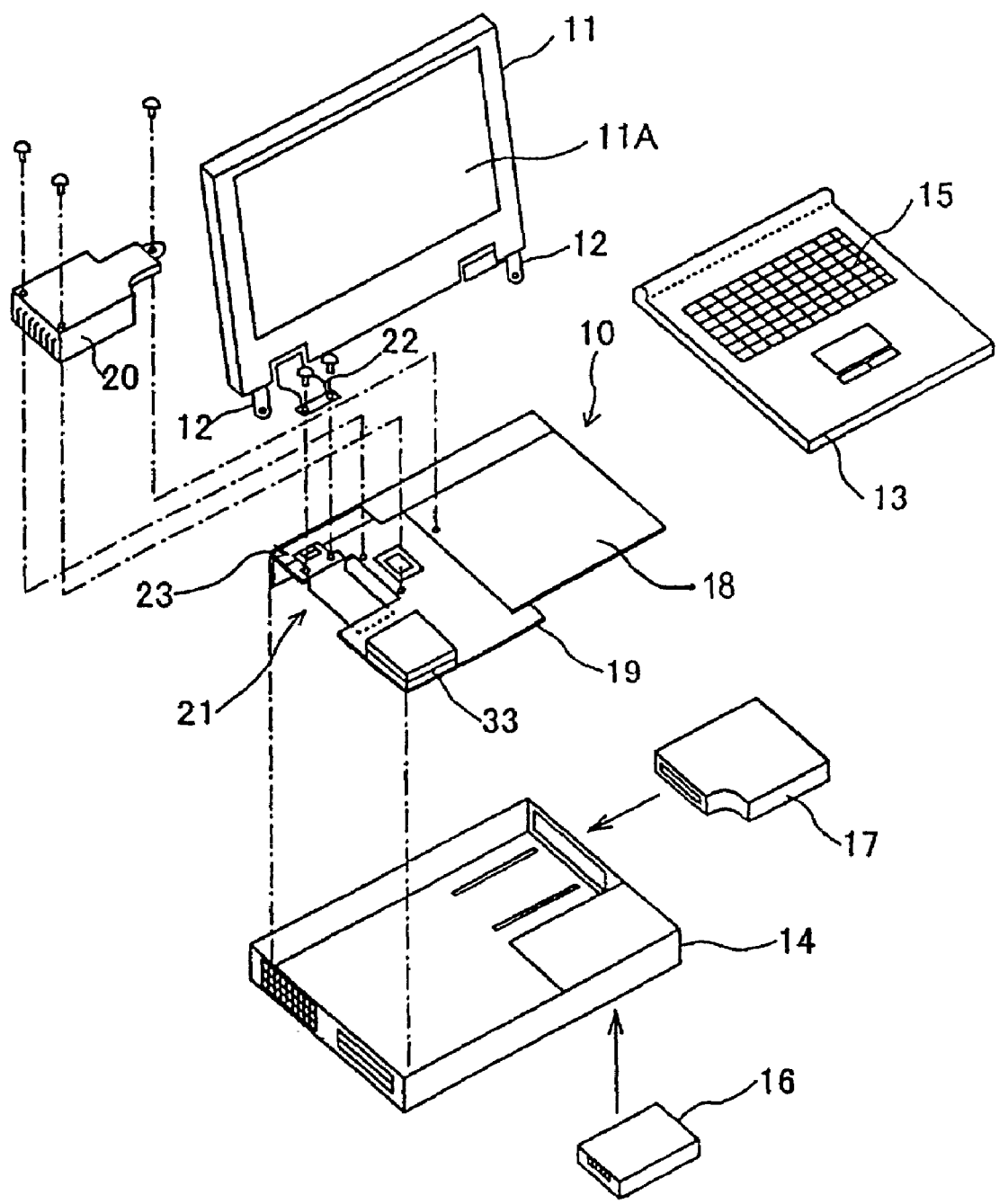
FIG. 1 is a disassembled perspective view showing an embodiment of an electronic equipment according to the present invention.

A description will be given of various embodiments of a substrate, a connecting structure and an electronic equipment according to the present invention, by referring to the drawings.

Figure 2:
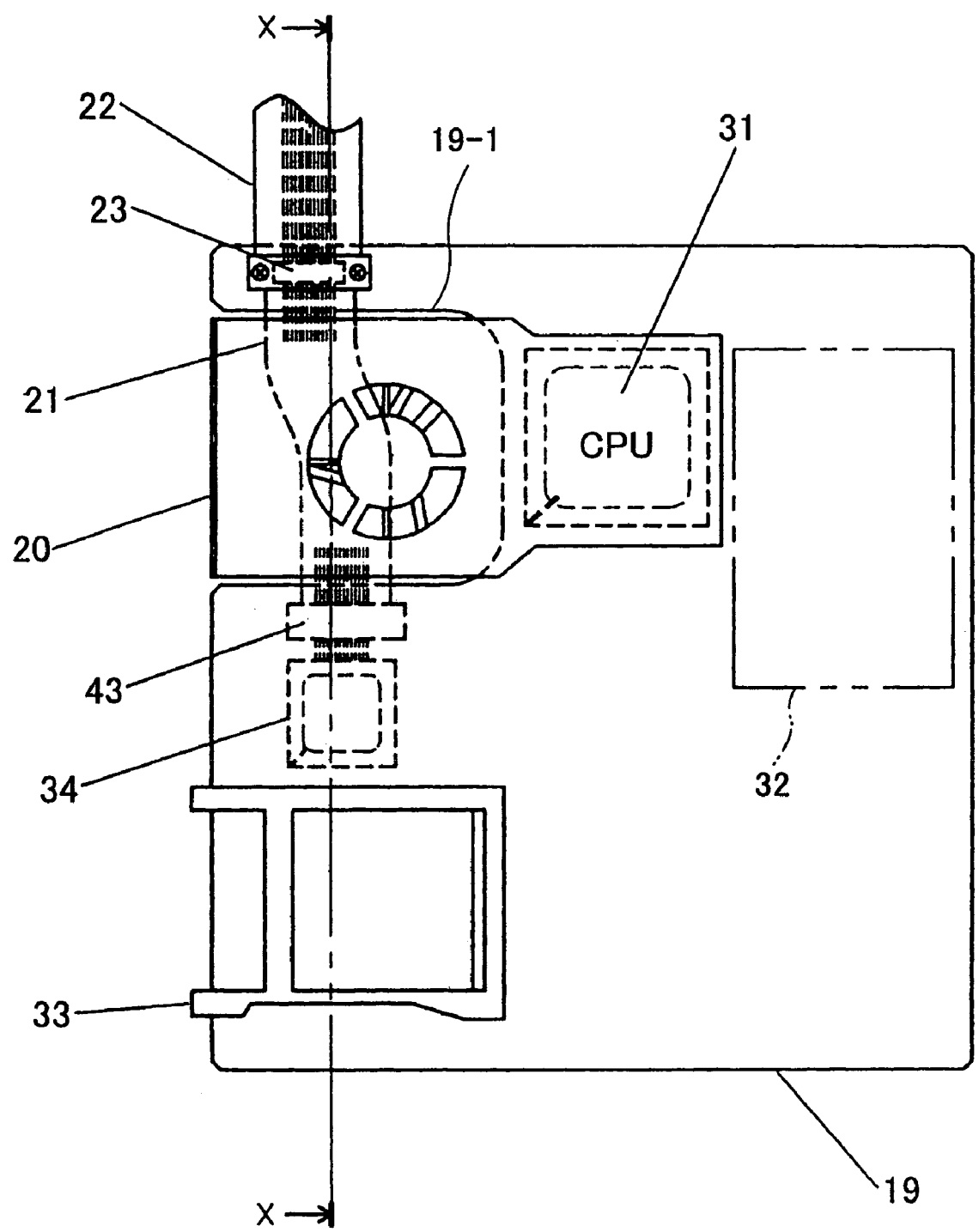
FIG. 2 is a plan view showing a substrate of the embodiment of the electronic equipment.
Figure 3:
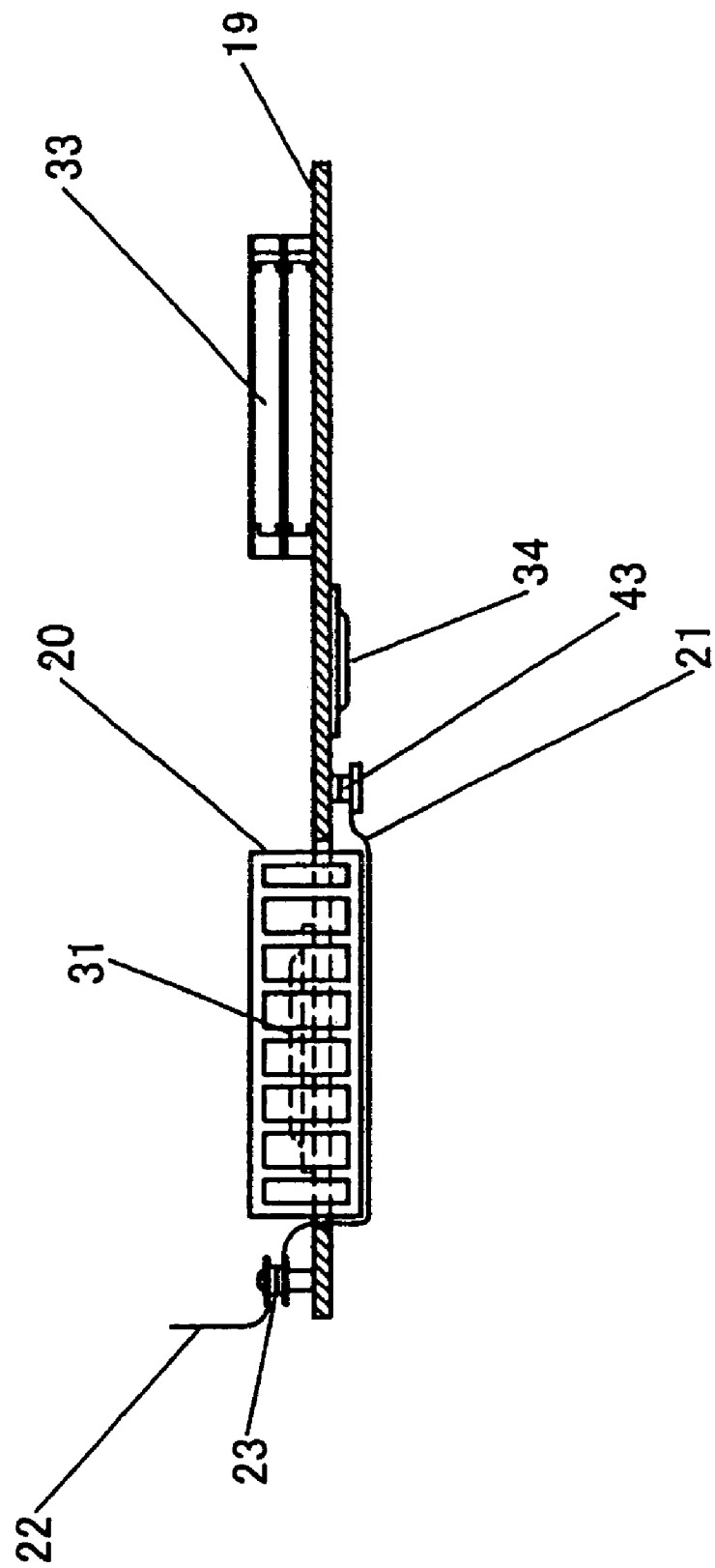
FIG. 3 is a cross sectional view showing the substrate cut along a line X—X in FIG. 2.
Figure 4:
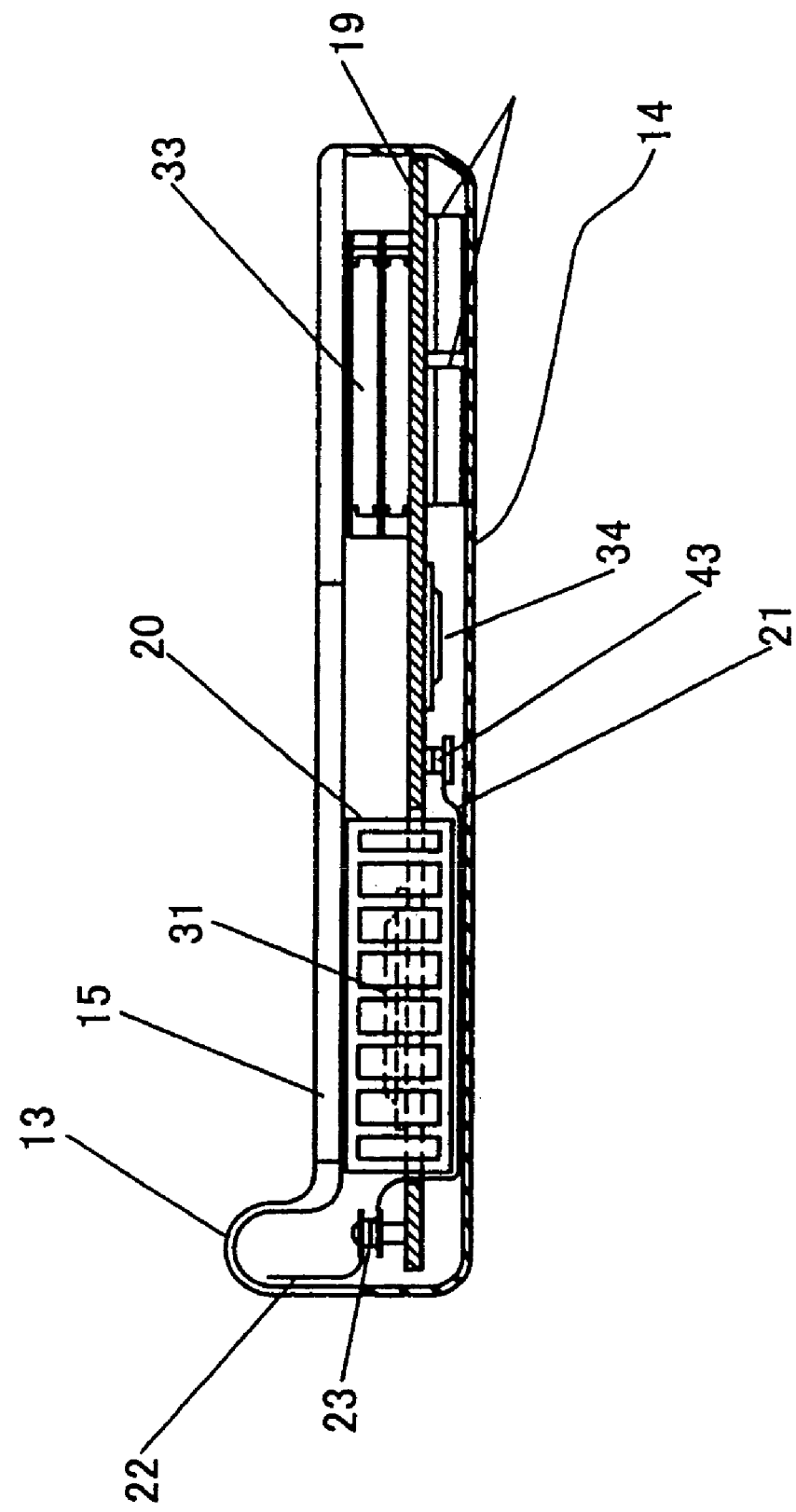
FIG. 4 is a side view showing the embodiment of the electronic equipment viewed from the left side.

FIG. 1 is a disassembled perspective view showing an embodiment of the electronic equipment according to the present invention. FIG. 2 is a plan view showing a substrate of this embodiment of the electronic equipment. FIG. 3 is a cross sectional view showing the substrate cut along a line X—X in FIG. 2. FIG. 4 is a side view showing this embodiment of the electronic equipment viewed from the left side. This embodiment of the electronic equipment uses an embodiment of the substrate according to the present invention and an embodiment of the connecting structure according to the present invention. Further, in this embodiment, the present invention is applied to a lap-top personal computer.

As shown in FIG. 1, the lap-top personal computer is generally made up of a main body 10 and a lid 11 having a display section 11A. The display section 11A is formed by a LCD panel, for example. The lid 11 has a structure capable of opening and closing with respect to the main body 10 via a hinge 12. The main body 10 is assembled from a top cover 13 and a lower cover 14. A keyboard 15 is provided on the top cover 13. A battery 16 and a disk drive 17 for disks such as CDs and DVDs are mounted on the lower cover 14.

A frame 18 and a main board (hereinafter simply referred to as a substrate) 19 which is fixed to the frame 18, are provided within the main body 10. Various electronic parts such as an IC chip, and various parts such as a heat sink 20 are provided on the substrate 19. The electronic parts such as the IC chip are electrically connected via a printed wiring (electrical wiring pattern) on the substrate 19 and a FPC 21. As will be described later, the electrical connection between the display section 11A and the substrate 19 is made using a FPC 22. One end of the FPC 22 is connected to the display section 11A, and the other end of the FPC 22 is connected to a first connecting part 23 which is provided on a top surface of the substrate 19. The first connecting part 23 electrically connects the other end of the FPC and one end of the FPC 21. As will be described later, the other end of the FPC 22 is electrically connected to the electronic parts such as the IC chip on the substrate 19 via another connecting part and the printed wiring on the substrate 19.

As shown in FIGS. 2 through 4, a CPU 31, an electronic circuit part 32 such as a power supply circuit, a PC card slot 33 and the like are provided on the top surface of the substrate 19. A graphic LSI 34, a second connecting part 43 and the like are provided on a bottom surface of the substrate 19. The printed wirings (not shown) provided on the top and bottom surfaces of the substrate 19 and the FPC 21 electrically connect the electronic parts provided on the top and bottom surfaces of the substrate 19 and the connecting parts 23 and 43.

In this embodiment, a cutout 19-1 is provided in the substrate 19 and the heat sink 20 is arranged within this cutout 19-1, in order to efficiently radiate heat generated from the CPU 31. For this reason, if the graphic LSI 34 which is to be connected to the display section 11A were to be connected to the first connecting part 23 via the printed wiring on the top surface of the substrate 19, the connection would have to be made by detouring around the heat sink 20, the CPU 31 and the electronic circuit part 32, and the degree of freedom of wiring would become small due to the restrictions with respect to the printed wiring. In addition, if the graphic LSI 34 were to be connected to the first connecting part 23 via the printed wiring on the bottom surface of the substrate 19, the connection would have to be made by detouring around the parts such as the heat sink 20, and the connection would also require a via hole or the like to connect the printed wirings on the top and bottom surfaces of the substrate 19. Hence, the degree of freedom of wiring would also become small in this latter case due to the restrictions with respect to the printed wiring.

Hence, in this embodiment, the graphic LSI 34 and the display section 11A are connected via the FPC 21 by connecting to the first connecting part 23. The FPC 21 has an electrically insulated surface and a sufficiently compliant flexibility. Hence, the FPC 21 is bent freely from the top surface side to the bottom surface side of the substrate 19, from the first connecting part 23 via the cutout 19-1. In addition, the FPC 21 is connected to the graphic LSI 23 via the second connecting part 43 along the bottom surface of the heat sink 20. As a result, the degree of freedom of wiring does not become small due to the restrictions with respect to the printing wiring on the substrate 19. In addition, because the FPC 21 is thin, the thickness of the lap-top personal computer does not increase by the use of the FPC 21 for the connection. Furthermore, because the graphic LSI 34 on the substrate 19 is connected to the display section 11A by the FPC 21 by connecting to the FPC 22 from the lid 11, the wiring for connecting the graphic LSI 34 on the substrate 19 to the display section 11A does not occupy the space on the substrate 19 for providing the various parts and the printed wiring, thereby enabling the size of the electronic equipment to the reduced.

In this embodiment, the first connecting part 23 and the second connecting part 43 are provided at positions mutually deviated in the horizontal direction in FIG. 2. Thus, the FPC 21 has a curved shape at an intermediate portion thereof as indicated by a dotted line in FIG. 2. However, the FPC 21 may of course have a shape which extends linearly. In addition, although the FPC 21 is bent from the top surface side to the bottom surface side of the substrate 19, the FPC 21 may exist only on the top or bottom surface of the substrate 19.

Figure 5:
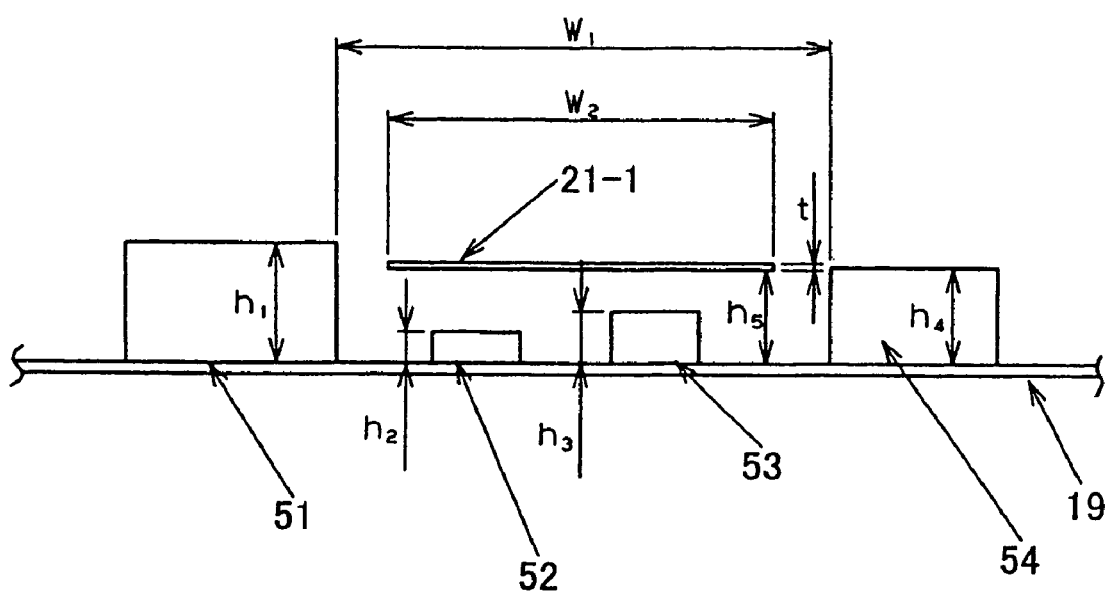
FIG. 5 is a diagram for explaining positional relationships of heights of parts on the substrate and a FPC.

Next, a description will be given of the conditions for not increasing the thickness of the lap-top personal computer even when the FPC is used, by referring to FIG. 5. FIG. 5 is a diagram for explaining the positional relationships of the heights of the parts on the substrate 19 and a FPC 21-1. In FIG. 5, it is assumed for the sake of convenience that the FPC 21-1 has a shape which extends linearly, and that parts 51 through 54 respectively having heights h1 through h4 are provided on the substrate 19, where h1>h4>h3>h2. The height h4 of the part 54 is the highest, and determines the thickness of the lap-top personal computer) W1 denotes a distance between the parts 51 and 54, and W2 denotes a width of the FPC 21-1.

The parts 52 and 53 are arranged under the FPC 21-1, and of these parts 52 and 53, the height h3 of the part 53 is the highest. The height h4 of the part 54 is larger than a sum (h5+t) of a height h5 and a thickness t of the FPC 21-1. Accordingly, a relationship h1>h4>(h5+t) stands. In this case, if (h1−t)>h3 and W1>W2, the use of the FPC 21-1 will not increase the thickness of the lap-top personal computer.

Next, a description will be given of the structure of the first connecting part 23, by referring to FIGS. 6A through 6C and FIGS. 7A and 7B. FIGS. 6A, 6B and 6C are diagrams showing the structure of the connecting part 23. FIGS. 7A and 7B are diagrams for explaining a screw portion of the connecting part 23.

FIG. 6A shows a plan view of the first connecting part 23, FIG. 6B shows a side view of the connecting part 23 when viewed from the left side in FIG. 2, and FIG. 6C shows a side view of the connecting part 23 when viewed from the bottom side in FIG. 2. As shown in FIGS. 6A through 6C, a top contacting part 221 is provided on the end portion of the FPC 22. Two penetrating screw holes for receiving corresponding screws 230, and a connecting portion 222 made up of a plurality of contacts are provided on the top contacting part 221. The contacts of the connecting portion 222 are connected to corresponding lines of the FPC 22. On the other hand, a bottom contacting part 211 is provided on the end portion of the FPC 21. An inserting portion 211-10 which can be inserted between two spacers 231, and a connecting portion 212 made up of a plurality of contacts are provided on the bottom contacting part 211. The contacts of the connecting portion 212 are connected to corresponding lines of the FPC 22. As shown in FIGS. 6A through 6C, the contacts of the connecting portion 212 make contact with the corresponding contacts of the connecting portion 222 in a state where the contacting parts 211 and 221 of the FPCs 21 and 22 are connected.

FIG. 7A shows a plan view of the spacer 231, and FIG. 7B shows a side view of the spacer 231. As shown in FIGS. 7A and 7B, the spacer 231 has a flange 231-1 having a diameter φA, a groove 231-2, and a flange 231-3 having a diameter φB. A screw thread 230-1 is provided within the spacer 231, and the screw 230 can be tightened with respect to the spacer 231. The FPCs 21 and 22 are connected by inserting the inserting portion 211-10 of the bottom contacting part 211 of the FPC 21 between the flanges 231-1 and 231-3 in a state where the contacting part 221 of the FPC 22 is provisionally connected to the flanges 231-1 of the spacers 231 by the screws 230, and thereafter tightening the screws 230.

By setting the diameters to satisfy φB>φA, it is possible to provisionally position the FPC 21 by inserting the inserting portion 211-10 of the bottom contacting part 211 of the FPC 21 into the groove 231-2. In addition, when viewed from the top, the flange 231-3 is not hidden by the flange 231-1, and thereby facilitating the operation of inserting the inserting portion 211-10 into the groove 231-2. The flange 231-3 has a function of receiving the contacting part 211 of the FPC 21 when the connecting portions 212 and 222 of the FPCs 21 and 22 are connected. The flange 231-1 has a function of preventing the FPC 21 from being lifted up when disconnecting the FPCs 21 and 22. When the spacer 231 has a height h7 from the top surface of the substrate 19 to a lower surface of the flange 231-3, it is possible to provide parts 55 having a height h6 which satisfies a relationship h7>h6 on the top surface of the substrate 19 in a vicinity of the connecting part 23 as shown in FIG. 6B, by using the connecting structure described above. Hence, the area on the substrate 19 can be utilized efficiently.

In this embodiment, the top contacting part 221 of the FPC 22 is provisionally connected to the spacers 231 and the bottom contacting part 211 of the FPC 21 is inserted with respect to the contacting part 221. However, it is of course possible to employ a structure such that the contacting part 211 of the FPC 21 is provisionally connected to the spacers 231 and the contacting part 221 of the FPC 22 is inserted with respect to the contacting part 211.

In this embodiment, the connecting part 43 provided on the bottom surface of the substrate 19 is connected to the printed wiring which is formed on the bottom surface of the substrate 19 by a connecting structure similar to that used conventionally, without the use of the spacers 231. More particularly, a contacting part having a structure similar to that of the top contacting part 221 of the FPC 22 and having a connecting portion is located on the end portion of the FPC 21 opposite to the end portion provided with the contacting part 211, and this contacting part of the FPC 21 is secured on the substrate 19 by screws in a state where contacts of the connecting portion make contact with the corresponding printed wiring on the substrate 19. However, if the FPC 21 is to be connected to another FPC at the second connecting part 43, this connecting part 43 may employ the same connecting structure as the first connecting part 23.

Next, a description will be given of various embodiments of the FPC, by referring to FIGS. 8 through 11.

FIG. 8 is a diagram for explaining the first embodiment of the FPC. In FIG. 8, contacting parts 211-1 and 211-2 having a plurality of contact, similarly to the contacting part 211 shown in FIGS. 6A through 6C, are provided on respective end portions of a FPC 21-2. An intermediate portion of the FPC 21-2 is curved in a generally S-shape, so as to avoid the positions of the parts 51 and 54 provided on the substrate 19.

Figure 9:
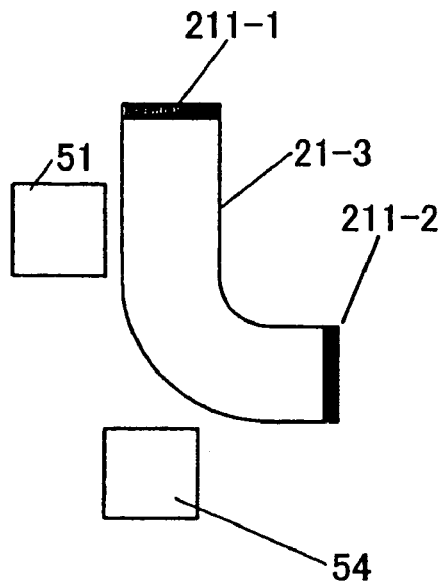
FIG. 9 is a diagram for explaining a second embodiment of the FPC.

FIG. 9 is a diagram for explaining the second embodiment of the FCP. In FIG. 9, contacting parts 211-1 and 211-2 are provided on respective end portions of a FPC 21-3. An intermediate portion of the FPC 21-3 is curved in a generally L-shape, so as to avoid the positions of the parts 51 and 54 provided on the substrate 19.

Figure 10:
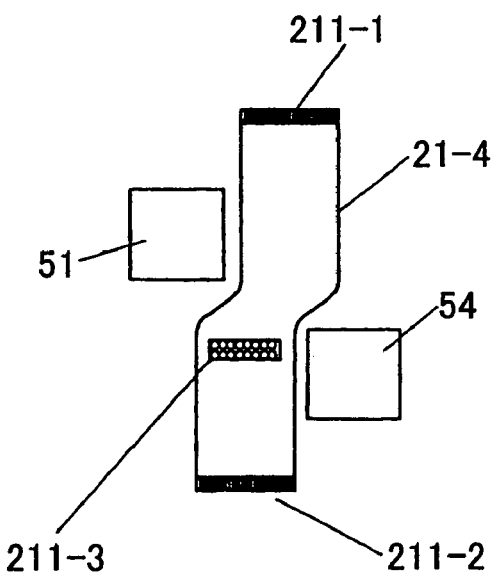
FIG. 10 is a diagram for explaining a third embodiment of the FPC.

FIG. 10 is a diagram for explaining the third embodiment of the FPC. In FIG. 10, contacting parts 211-1 and 211-2 are provided on respective end portions of a FPC 21-4. An intermediate portion of the FPC 21-4 is curved in a generally S-shape, so as to avoid the positions of the parts 51 and 54 provided on the substrate 19. Furthermore, a contacting part 211-3 is provided at an intermediate portion of the FPC 21-4. The contacting part 211-3 has a connecting portion with a plurality of contacts, similarly to the contacting part 211 shown in FIGS. 6A through 6C. The contacts of the connecting portion of the contacting part 211-3 may be connected to the printed wiring on the substrate 19, similarly to the case of the connecting part 43, for example, or connected to a connecting portion of another FPC, similarly to the case of the connecting part 23. In this case, it is possible to make the wiring connections which are required at three locations on the substrate 19.

Figure 11:
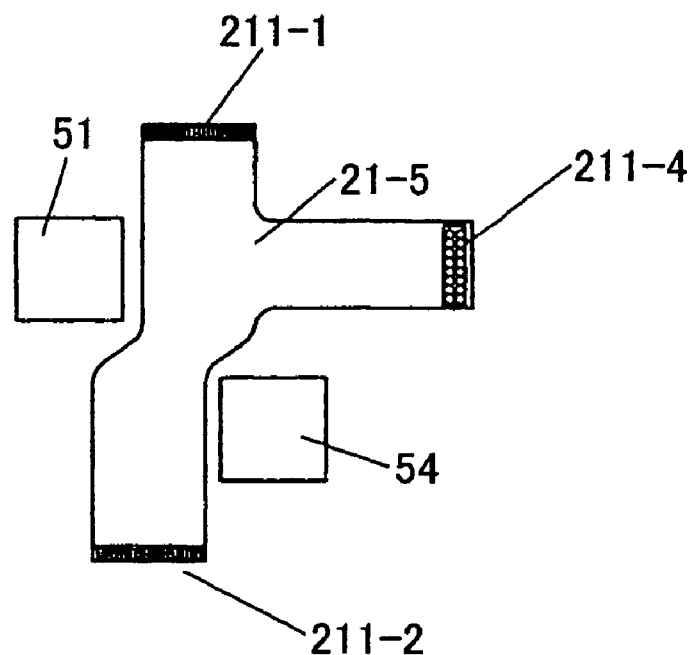
FIG. 11 is a diagram for explaining a fourth embodiment of the FPC.

FIG. 11 is a diagram for explaining the fourth embodiment of the FPC. In FIG. 11, a FPC 21-5 has a shape which branches into three portions and avoids the positions of the parts 51 and 54 provided on the substrate 19. Connector parts 211-1, 211-2 and 211-4 are provided on the three end portions of the FPC 21-5. Each of the contacting parts 211-1, 211-2 and 211-4 has a connecting portion with a plurality of contacts, similarly to the contacting part 211 shown in FIGS. 6A through 6C. The contacts of the connecting portion of each of the contacting parts 211-1, 211-2 and 211-4 may be connected to the printed wiring on the substrate 19, similarly to the case of the second connecting part 43, for example, or connected to a connecting portion of another FPC, similarly to the case of the first connecting part 23. In this case, it is possible to make the wiring connections which are required at three locations on the substrate 19.

In FIGS. 8 through 11, the FPCs have shapes so as to avoid positions of the parts provided on the substrate. However, the FPC may pass above one ore more parts having a relatively low height. In addition, the shape of the FPC may of course be selected depending on the wiring length restrictions and to prevent mixture of external noise. Moreover, the FPC may of course have more than three contacting parts.

Figure 12:
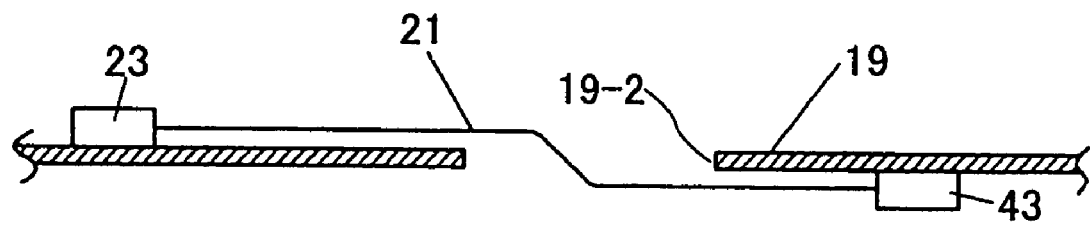
FIG. 12 is a diagram for explaining a connection state of the FPC.
Figure 13:
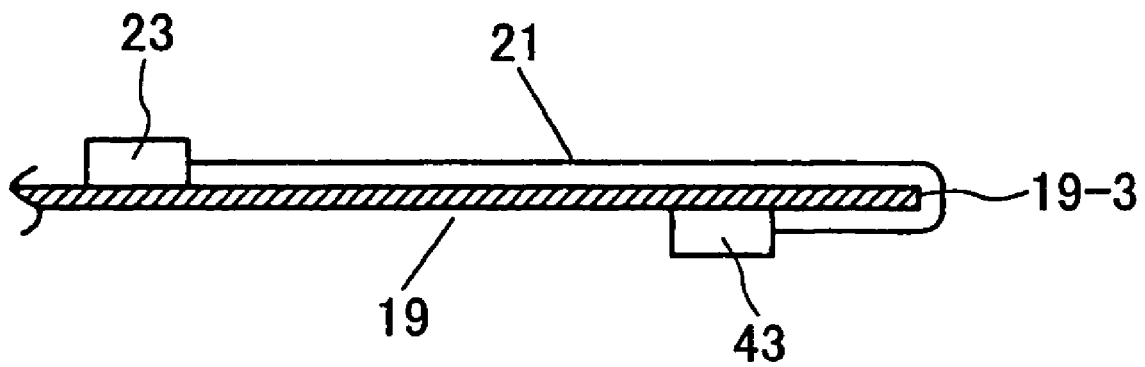
FIG. 13 is a diagram for explaining another connection state of the FPC.

Next, a description will be given of the connection state of the FPC, by referring to FIGS. 12 and 13. FIG. 12 is a diagram for explaining a connection state of the FPC, and FIG. 13 is a diagram for explaining another connection state of the FPC. FIGS. 12 and 13 show a case where one end of the FPC is connected to the top surface side of the substrate 19, and the other end of the FPC is connected to the bottom surface side of the substrate 19.

In FIG. 12, one end of the FPC 21 is connected to the first connecting part 23 on the top surface side of the substrate 19. The intermediate portion of the FPC 21 is bent towards the bottom surface side of the substrate 19 via an opening 19-2 which is formed in the substrate 19. In addition, the other end of the FPC 21 is connected to the second connecting part 43 on the bottom surface side of the substrate 19. Hence, the FPC 21 may be freely arranged on both the top and bottom surface sides of the substrate 19 via the opening 19-2 in the substrate 19.

In FIG. 13, one end of the FPC 21 is connected to the first connecting part 23 on the top surface side of the substrate 19. The intermediate portion of the FPC 21 is bent towards the bottom surface side of the substrate 19 along an edge 19-3 of the substrate 19. In addition, the other end of the FPC 21 is connected to the second connecting part 43 on the bottom surface side of the substrate 19. Accordingly, the FPC 21 may be freely arranged on both the top and bottom surface sides of the substrate 19, without having to form an opening or a cutout in the substrate 19, by bending the FPC 21 along the edge 19-3 of the substrate 19.

In the embodiment of the electronic equipment described above, two FPCs 21 and 22 are provided with respect to the substrate 19. However, the electrical connecting bodies are not limited to the FPC, and a wire harness may be used, for example. In other words, the electrical connecting body may be formed by various means other than the printed wiring (electrical wiring pattern) formed on the substrate, 19. In addition, the electrical connecting bodies such as the FPCs 21 and 22 simply need to electrically connect one portion on the substrate 19 and another portion, and one or three or more electrical connecting bodies may be used. In this case, the other portion to be connected to the one portion on the substrate 19 by the one or more electrical connecting bodies may be located on the substrate 19 or located outside the substrate 19.

Therefore, the present invention is also applicable to the substrate 19 having no FPC 22 shown in FIG. 2, for example. For example, in a case where no circuit wiring space is available on the right side of the CPU 31 shown in FIG. 2 on the top surface of the substrate 19, the parts which need to be connected to the graphic LSI 34 must be arranged below the CPU 31, for example, in FIG. 2 if the conventional technique is used. But according to the present invention, it is possible to make the necessary connection using the electrical connecting body such as the FPC. As a result, the present invention enables the parts which need to be connected to the graphic LSI 34 to also be arranged above the CPU 31 in FIG. 2, thereby effectively utilizing the limited space on the substrate 19.

The application of the present invention is of course not limited to the lap-top personal computer, and the present invention is similarly applicable to various electronic equipments such as information processing apparatuses and portable telephones which are made up of a main body and a lied which opens and closes with respect to the main body.

Further, the present invention is not limited to these embodiments, but various variations and modifications may be made without departing from the scope of the present invention.

What is claimed is:

1. A substrate assembly comprising:
   a single substrate;
   an electrical wiring pattern formed on the substrate;
   one or a plurality of electrical parts provided on the substrate;
   a first contacting part and a second contacting part provided on the substrate, at least the first contacting part being configured to electrically connect to the one or the plurality of electronic parts; and
   a plurality of electrical connecting bodies, different from the electrical wiring pattern and each having a pair of connecting portions, configured to electrically connect to at least one of the first contacting part and the second contacting part,
   wherein at least the second contacting part comprises a spacer having flanges configured to receive corresponding connecting portions of two of the plurality of electrical connecting bodies at predetermined heights from the substrate and to electrically connect the corresponding connecting portions of said two of the plurality of electrical connecting bodies.

2. The substrate assembly as claimed in claim 1, wherein the plurality of electrical connecting bodies are flexible.

3. A substrate assembly comprising:
   a single substrate;
   an electrical wiring pattern formed on the substrate;
   one or a plurality of electrical parts provided on the substrate; and
   a first contacting part and a second contacting part provided on the substrate, at least the first contacting part being configured to electrically connect to the electronic parts,
   said first contacting part and said second contacting part being electrically connected via one or a plurality of electrical connecting bodies different from the electrical wiring pattern and each having a pair of connecting portions,
   wherein at least the second contacting part comprises a spacer having flanges configured to receive corresponding connecting portions of at least two of the plurality of electrical connecting bodies at predetermined heights from the substrate and to electrically connect the corresponding connecting portions of said at least two of the plurality of electrical connecting bodies.

4. The substrate assembly as claimed in claim 3, wherein the one or the plurality of electrical connecting bodies are flexible.

5. A connecting structure for connecting a first electrical connecting body and a second electrical connecting body, said first electrical connecting body having a first contacting part electrically connected to one or a plurality of electronic parts provided on a first surface of a single substrate and a second contacting part, said second electrical connecting body having a first contacting part electrically connected externally to the substrate and a second contacting part, said connecting structure comprising:
   a connecting part, provided on the substrate, and comprising a spacer having flanges configured to receive the second contacting part of the first electrical connecting body and the second contacting part of the second electrical connecting body at height positions separated by predetermined distances from the first surface of the substrate and to electrically connect the second contacting part of the first electrical connecting body and the second contacting part of the second electrical connecting body.

6. The connecting structure as claimed in claim 5, wherein said first electrical connecting body extends over a part which is provided on the first surface of the substrate and has a height lower than a difference which is obtained by subtracting a thickness of said first electrical connecting body from a height of a highest part provided on the first surface of the substrate.

7. The connecting structure as claimed in claim 5, wherein the first and second electrical connecting bodies are flexible.

8. An electronic equipment comprising:
a single substrate having an electrical wiring pattern formed thereon;
a first contacting part provided on the substrate and configured to electrically connect to one or more electronic parts provided on the substrate;
a second contacting part provided on the substrate; and
a plurality of electrical connecting bodies, different from the electrical wiring pattern and each having a pair of connecting portions, configured to electrically connect to at least one of the first contacting part and the second contacting part,
wherein at least the second contacting part comprises a spacer having flanges configured to receive corresponding connecting portions of two of the plurality of electrical connecting bodies at predetermined heights from the substrate and to electrically connect the corresponding connecting portions of said two of the plurality of electrical connecting bodies.

9. The electronic equipment as claimed in claim 8, wherein the electrical connecting body is flexible.

10. An electronic equipment comprising:
a single substrate having an electrical wiring pattern formed thereon;
a first contacting part provided on the substrate and configured to electrically connect to one or more electronic parts provided on the substrate; and
a second contacting part provided on the substrate,
said first contacting part and said second contacting part being electrically connected via a plurality of electrical connecting bodies different from the electrical wiring pattern and each having a pair of connecting portions,
wherein the second contacting part comprises a spacer having flanges configured to receive corresponding connecting portions of at least two of the plurality of electrical connecting bodies at predetermined heights from the substrate and to electrically connect the corresponding connecting portions of said at least two of the plurality of electrical connecting bodies.

11. The electronic equipment as claimed in claim 10, wherein the electrical connecting body is flexible.

12. A connecting structure comprising:
an electrical wiring pattern formed on a single substrate;
one or a plurality of electrical parts provided on the substrate;
a first contacting part and a second contacting part provided on the substrate, at least the first contacting part being configured to electrically connect to the electronic parts; and
a plurality of electrical connecting bodies, different from the electrical wiring pattern and each having a pair of connecting portions, configured to electrically connect to at least one of the first contacting part and the second contacting part,
wherein at least the second contacting part comprises a spacer having flanges configured to receive corresponding connecting portions of two of the plurality of electrical connecting bodies at predetermined heights from the substrate and to electrically connect the corresponding connecting portions of said two of the plurality of electrical connecting bodies.

13. The connecting structure as claimed in claim 12, wherein the first and second electrical connecting bodies are flexible.

14. A connecting structure comprising:
an electrical wiring pattern formed on a single substrate;
one or a plurality of electrical parts provided on the substrate; and
a first contacting part and a second contacting part provided on the substrate, at least the first contacting part being configured to electrically connect to the electronic parts,
said first contacting part and said second contacting part being electrically connected via one or a plurality of electrical connecting bodies different from the electrical wiring pattern and each having a pair of connecting portions,
wherein at least the second contacting part comprises a spacer having flanges configured to receive corresponding connecting portions of at least two of the plurality of electrical connecting bodies at predetermined heights from the substrate and to electrically connect the corresponding connecting portions of said at least two of the plurality of electrical connecting bodies.

15. The connecting structure as claimed in claim 14, wherein the one or the plurality of electrical connecting bodies are flexible.

* * * * *